(12) United States Patent
Fukazawa

(10) Patent No.: US 9,478,672 B2
(45) Date of Patent: Oct. 25, 2016

(54) DIODE

(71) Applicant: DENSO CORPORATION, Kariya, Aichi-pref. (JP)

(72) Inventor: Takeshi Fukazawa, Nagoya (JP)

(73) Assignee: DENSO CORPORATION, Kariya (JP)

(*) Notice: Subject to any disclaimer, the term of this patent is extended or adjusted under 35 U.S.C. 154(b) by 66 days.

(21) Appl. No.: 13/959,904

(22) Filed: Aug. 6, 2013

(65) Prior Publication Data

US 2014/0034967 A1    Feb. 6, 2014

(30) Foreign Application Priority Data

Aug. 6, 2012 (JP) .................................. 2012-174282
Aug. 1, 2013 (JP) .................................. 2013-160707

(51) Int. Cl.
*H01L 29/866* (2006.01)
*H01L 27/08* (2006.01)
*H01L 27/06* (2006.01)

(52) U.S. Cl.
CPC ......... *H01L 29/866* (2013.01); *H01L 27/0814* (2013.01); *H01L 27/0629* (2013.01); *H01L 2224/48091* (2013.01); *H01L 2224/48137* (2013.01); *H01L 2224/48247* (2013.01); *H01L 2224/48257* (2013.01); *H01L 2924/1305* (2013.01); *H01L 2924/13055* (2013.01); *H01L 2924/13091* (2013.01)

(58) Field of Classification Search
CPC .................. H01L 29/66121; H01L 29/66128; H01L 29/66136; H01L 29/6609; H01L 29/66098; H01L 29/66106; H01L 29/7808; H01L 29/866; H01L 29/7395; H01L 27/0623; H01L 29/0847; H01L 27/0883; H01L 29/0696; F02P 3/051; F02P 11/02; H03K 17/08128; H03K 17/0828
USPC ........ 257/594, 656, 551, 601, 603, E21.614, 257/E29.335
See application file for complete search history.

(56) References Cited

U.S. PATENT DOCUMENTS

| | | | |
|---|---|---|---|
| 5,365,099 A * | 11/1994 | Phipps et al. | 257/328 |
| 5,631,187 A | 5/1997 | Phipps et al. | |
| 2008/0002100 A1* | 1/2008 | Kaneko et al. | 349/65 |
| 2008/0173935 A1* | 7/2008 | Miyajima | H01L 29/866 257/328 |
| 2010/0006848 A1* | 1/2010 | Fukuoka et al. | 257/66 |
| 2010/0084663 A1* | 4/2010 | Ishii | H01L 29/866 257/77 |
| 2011/0127522 A1* | 6/2011 | Yamazaki | 257/43 |
| 2011/0193112 A1* | 8/2011 | Inoue et al. | 257/91 |
| 2011/0260312 A1* | 10/2011 | Goto | 257/676 |
| 2013/0175656 A1* | 7/2013 | Anderson et al. | 257/490 |

FOREIGN PATENT DOCUMENTS

| | | | |
|---|---|---|---|
| JP | A-S49-053667 | * | 5/1974 |
| JP | S49-053667 | | 5/1974 |
| JP | S59-175164 | | 10/1984 |
| JP | 61178561 | * | 8/1986 |
| JP | H02-185069 | | 7/1990 |
| JP | H05-251632 | | 9/1993 |
| JP | 05-304282 | | 11/1993 |
| JP | 06-080313 | | 10/1994 |
| JP | 2009-130130 | | 6/2009 |

OTHER PUBLICATIONS

Office Action issued in Japanese App. No. 2013-160707 dated Apr. 21, 2015 (with partial English translation).

* cited by examiner

*Primary Examiner* — Jessica Stultz
*Assistant Examiner* — Mohammed R Alam
(74) *Attorney, Agent, or Firm* — Nixon & Vanderhye P.C.

(57) ABSTRACT

A diode is provided which includes at least one diode element which has a plurality of N-type regions and a plurality of P-type regions, the N-type regions and the P-type regions being alternately arranged in series to form PN junctions, and an insulated substrate which has electric insulation. The N-type regions and the P-type regions are formed on the insulated substrate.

7 Claims, 9 Drawing Sheets

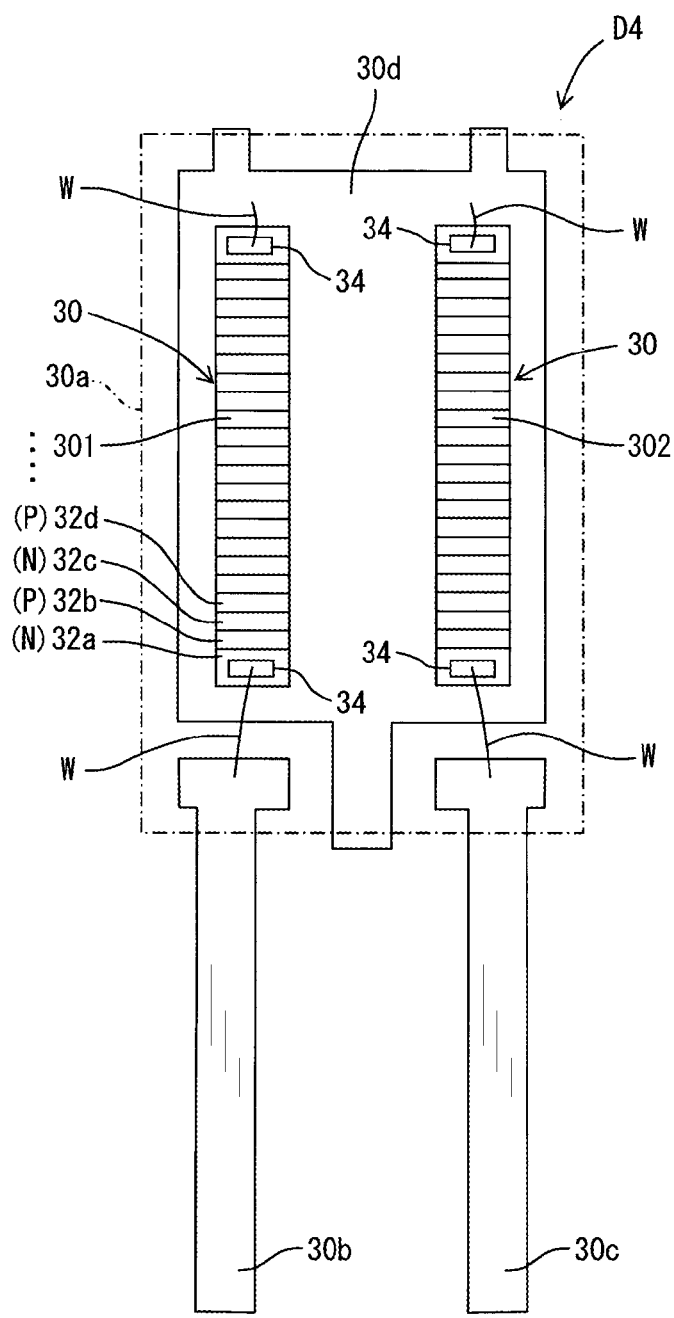
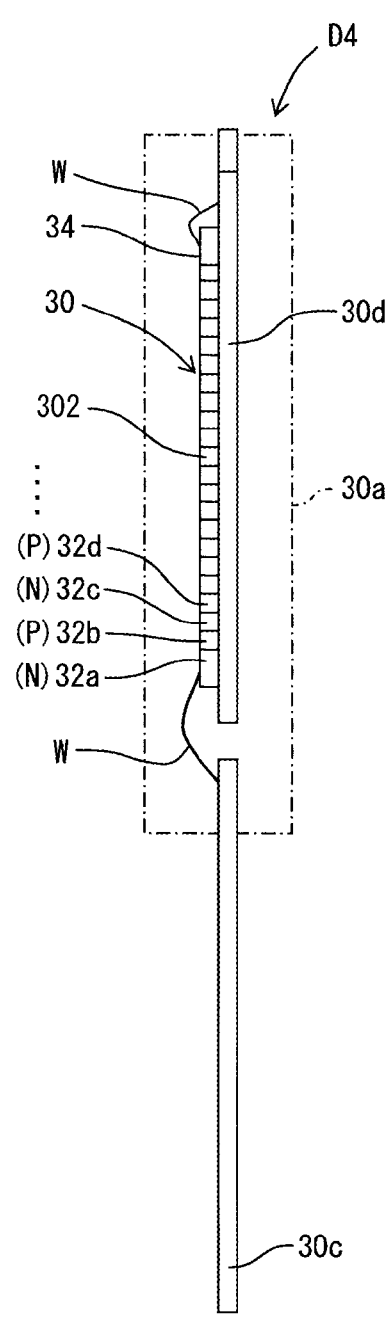

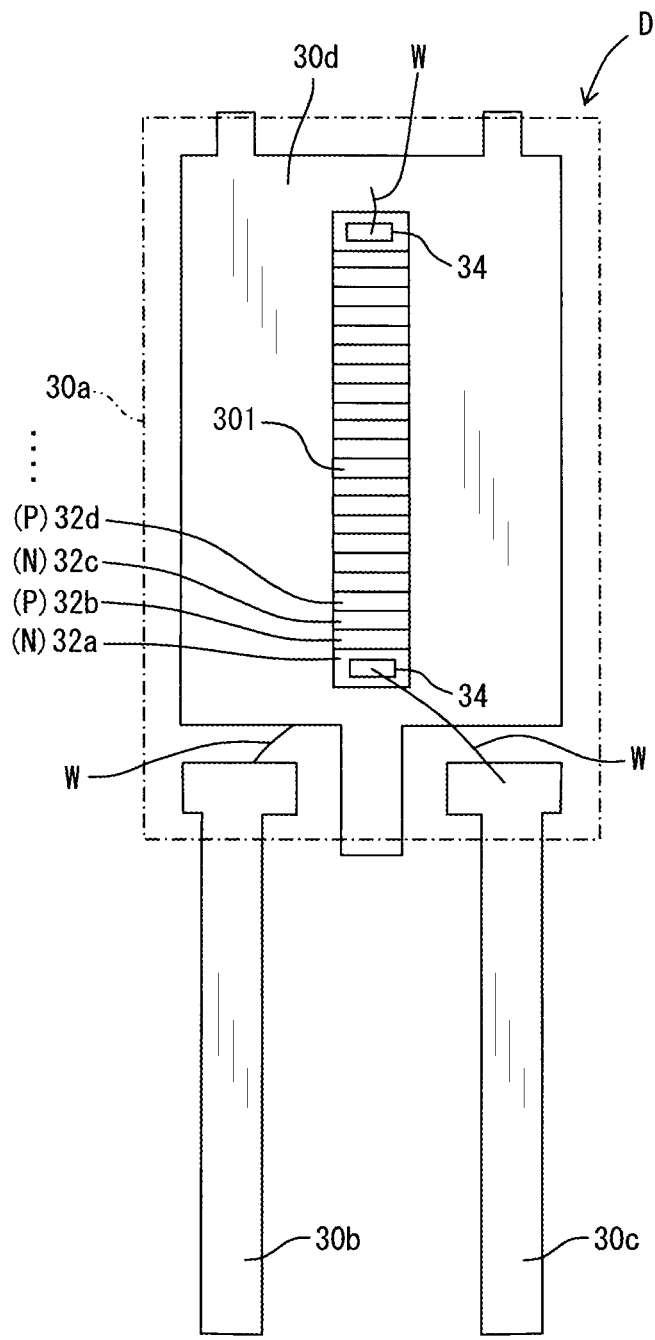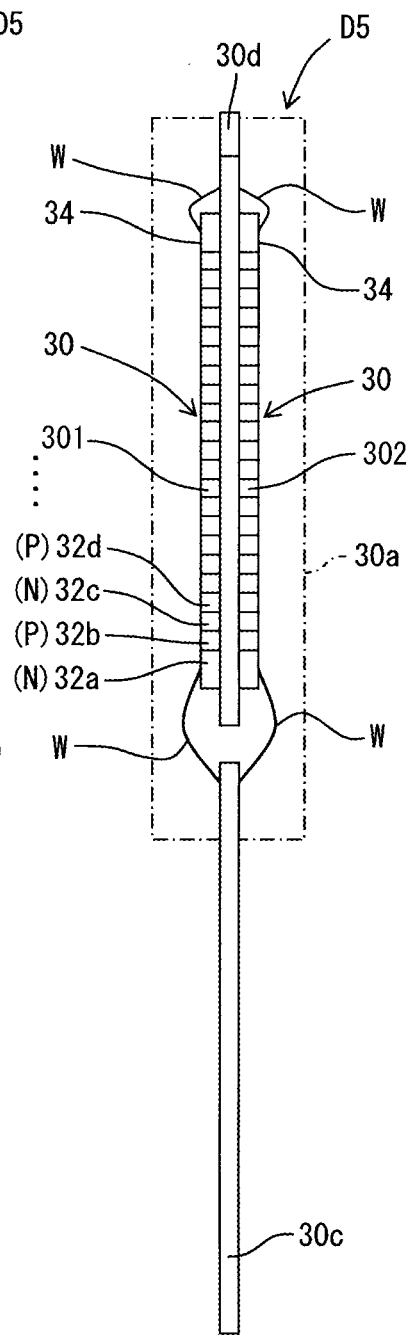

DIODE

CROSS-REFERENCE TO RELATED APPLICATION

This application is based on and claims the benefit of priority from earlier Japanese Patent Applications No. 2012-174282 filed Aug. 6, 2012 and No. 2013-160707 filed Aug. 1, 2013, the descriptions of which are incorporated herein by reference.

BACKGROUND

1. Technical Field

The present invention relates to a diode having a plurality of PN junctions.

2. Related Art

JP-B-6-80313 discloses a technique for providing a constant voltage element between a secondary coil and a spark plug of an ignition device. According to this technique, when a discharge voltage of the spark plug reaches a breakdown voltage of the constant voltage element, part of a secondary current flows from the constant voltage element to the ground. Hence, the discharge voltage can be prevented from becoming higher than the breakdown voltage, thereby extending the lifetime of the spark plug.

One example of this kind of constant voltage element is an avalanche diode. However, since the breakdown voltage of the avalanche diode has extremely high temperature dependence, the discharge voltage of the ignition device varies depending on the temperature.

To solve this problem, the inventor studied the use of a diode element $32x$, which is included in a semiconductor device of U.S. Pat. No. 5,365,099 (see FIG. 13), as a constant voltage element of a ignition device. This diode $32x$ has a plurality of N-type regions $32a$, $32c$ and a plurality of P-type regions $32b$, $32d$. The P-type regions and the N-type regions are alternately arranged in series on an oxide film 41 provided on a surface of a silicon substrate 40 to form PN junctions. Hence, the diode element $32x$ serves as an equivalent circuit in which a plurality of Zener diodes Da, Db, Dc are connected in series in a state where the adjacent diodes are opposite in direction to each other (see FIG. 5).

There is an inverse relationship between a temperature characteristic of voltage (forward voltage VF) obtained when a voltage is applied in the forward direction of the Zener diodes Da, Db, Dc (see FIG. 6A) and a temperature characteristic of Zener voltage (backward withstand voltage VR) obtained when a voltage is applied in the backward direction of the Zener diodes Da, Db, Dc (see FIG. 6B). That is, as the temperature becomes higher, the forward voltage becomes lower and the backward withstand voltage becomes higher. Hence, a pair of Zener diodes Da, Db, which are connected so as to be opposite in direction to each other and opposed to each other, mutually cancels increase and decrease of the voltage value caused due to the temperature characteristic. Hence, the temperature characteristic of the Zener voltage of the diode element $32x$ can be moderate.

In the case of the ignition device, an extremely high Zener voltage is required for the constant voltage element. However, the diode element $32x$ installed in the semiconductor element of U.S. Pat. No. 5,365,099 is not assumed to use such a high Zener voltage. Hence, the present inventor studied increasing the number of PN junctions of the diode element $32x$ disclosed in U.S. Pat. No. 5,365,099 to make the temperature characteristic moderate while having a high Zener voltage.

Meanwhile, in the semiconductor element of U.S. Pat. No. 5,365,099, the diode element $32x$ is integrated together with a power MOSFET or an IGBT element illustrated by reference numeral 42 in FIG. 13. Hence, the semiconductor element has a configuration in which the diode element $32x$ is mounted on a silicon substrate 40 forming various semiconductor elements.

The diode element $32x$ is formed on a silicon dioxide film 41 and is insulated from the silicon substrate 40. Hence, as studied above, if increasing the number of the PN junctions to increase the Zener voltage of the diode element $32x$, the silicon dioxide film 41, which is formed by thermal oxidation of silicon and has a thickness of about 1 µm, is limited to increasing withstand voltage (800 V at the most). Hence, it has found that the structure of the diode element $32x$ of U.S. Pat. No. 5,365,099 cannot sufficiently increase the Zener voltage.

In addition, if increasing the thickness of the silicon dioxide film 41 to increase the withstand voltage of the silicon dioxide film 41, large stress is generated at an interface of the silicon dioxide film 41 due to thermal expansion difference because thermal expansion coefficients are largely different between the silicon substrate 40 and the silicon dioxide film 41. In addition, it is basically difficult to form an oxide film having a thickness significantly exceeding 1 µm by thermal oxidation.

Note that the above problems similarly occur not only in a constant voltage element provided at the secondary side of the ignition device but also in diodes, for which high withstand voltage is required, such as one provided at the primary side of the ignition device and one provided in a device other than the ignition device.

SUMMARY

An embodiment provides a diode which has lower temperature dependence of Zener voltage and can make the Zener voltage sufficiently higher.

As an aspect of the embodiment, a diode is provided which includes at least one diode element which has a plurality of N-type regions and a plurality of P-type regions, the N-type regions and the P-type regions being alternately arranged in series to form PN junctions; and an insulated substrate which has electric insulation. The N-type regions and the P-type regions are formed on the insulated substrate.

BRIEF DESCRIPTION OF THE DRAWINGS

In the accompanying drawings:

FIGS. 9A and 9B are a diagram showing a diode according to a fourth embodiment;

FIGS. 10A and 10B are diagrams showing a diode according to a fifth embodiment;

DETAILED DESCRIPTION OF THE PREFERRED EMBODIMENTS

Figure 1:
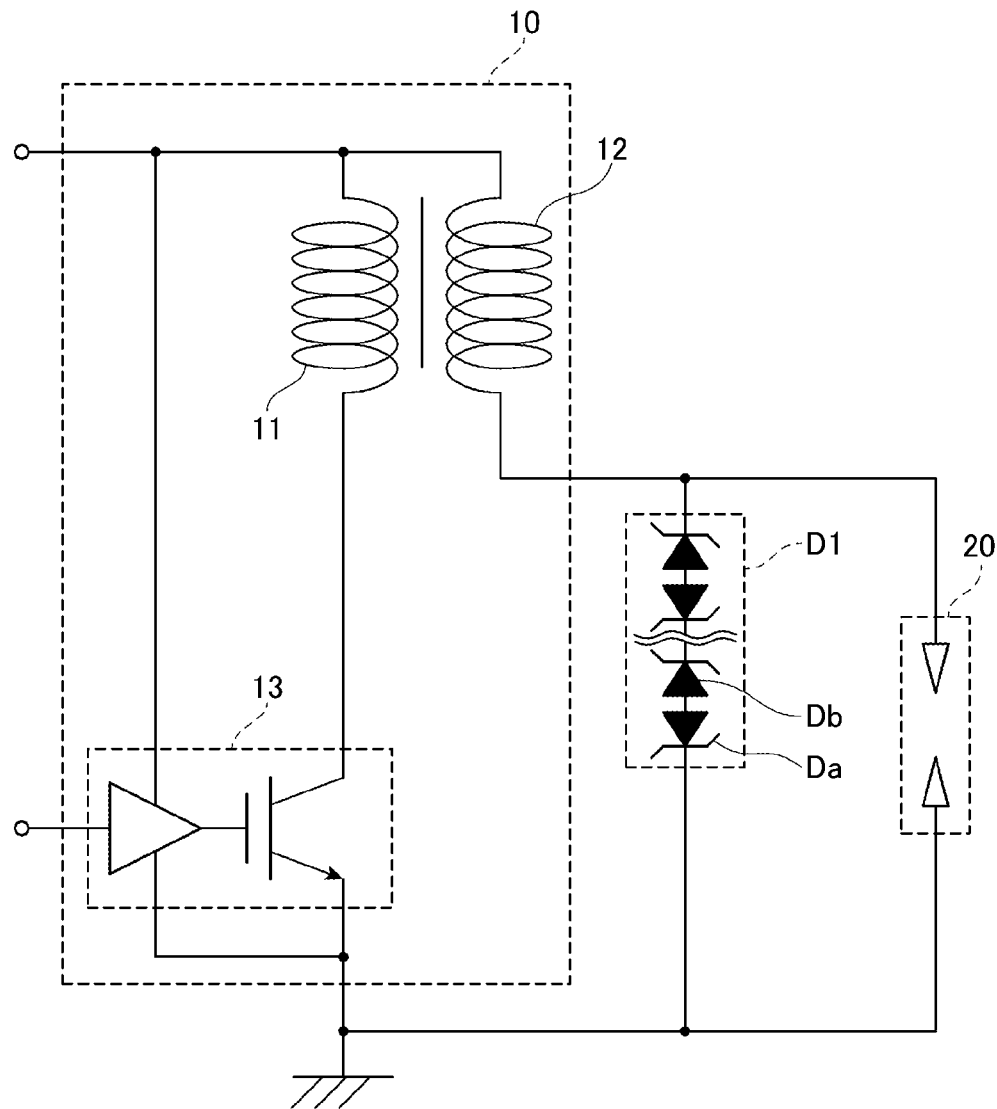
FIG. 1 is a diagram showing an ignition system to which a diode according to a first embodiment is applied.

With reference to the accompanying drawings, hereinafter are described embodiments of a diode according to the present invention. In the embodiments, the components which are identical with or similar to each other are given the same reference numerals for the sake of omitting unnecessary explanation.

(First Embodiment)

As shown in FIG. 1, a diode D1 according to the present embodiment is applied to an ignition system installed in an internal-combustion engine. This ignition system includes an ignition coil 10, an igniter 13, and a spark plug 20. The ignition coil 10 has a primary coil 11 and a secondary coil 12. The igniter 13 controls on-off of electric conduction to the primary coil 11. The spark plug 20 is connected to the secondary coil 12. In FIG. 1, the igniter 13 is incorporated into the ignition coil 10.

The igniter 13 has a switching element such as an IGBT (insulated gate bipolar transistor), and controls on-off switching of electric conduction to the primary coil 11 by turning on and off the switching element on the basis of an ignition command signal received from the outside of the ignition coil 10. Specifically, the igniter 13 first turns on the switching element to start electric conduction to the primary coil 11. Thereafter, the igniter 13 turns off the switching element to interrupt the electric conduction to the primary coil 11. Due to the interruption, the voltage of the secondary coil 12 (secondary voltage) is increased, which causes discharge in the spark plug 20.

Meanwhile, as combustion is provided in an internal-combustion engine in a higher compression and leaner burning state, a required value of discharge voltage (secondary voltage) for the spark plug 20 becomes higher. During a discharge period, the discharge voltage becomes a peak value (peak voltage) immediately after the discharge starts. However, as the required value becomes higher, the peak voltage also becomes higher. In this case, due to the application of high peak voltage to the spark plug 20, a concern rises that, for example, the spark plug 20 is damaged.

Figure 5:
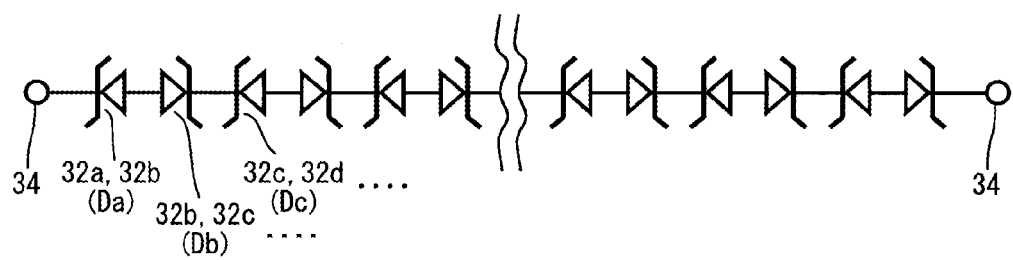
FIG. 5 is an equivalent circuit schematic of the diode according to the first embodiment.

To overcome this concern, in the present embodiment, a diode D1 is connected to the secondary side of the ignition coil 10. Specifically, the diode D1 is connected to the spark plug 20 in parallel. One end of the diode D1 is connected to the secondary coil 12, and the other end of the diode D1 is grounded. The diode D1 is configured so as to be an equivalent circuit in which a plurality of Zener diodes Da, Db, Dc (see FIG. 5) are connected in series in a state where the adjacent diodes are opposite in direction to each other.

Hence, when the discharge voltage exceeds the Zener voltage of the diode D1, secondary current passing through the secondary coil 12 flows to the ground through the diode D1. Thereby, a voltage equal to or more than the Zener voltage is prevented from being applied to the spark plug 20.

That is, the peak value of the discharge voltage is limited so as not to exceed the Zener voltage. In short, the diode D1 is a constant voltage diode which functions so as not to apply the voltage exceeding the Zener voltage to the spark plug 20.

Figure 2:
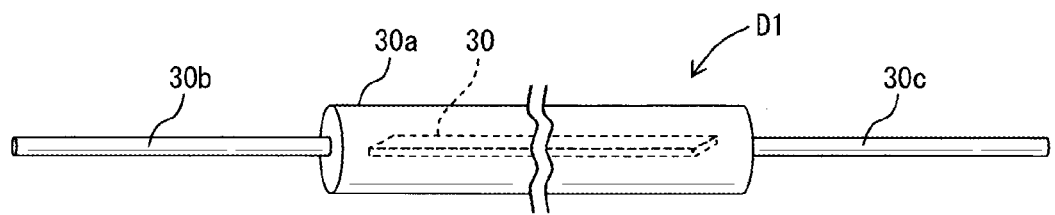
FIG. 2 is a perspective view showing a single diode.
Figure 3:
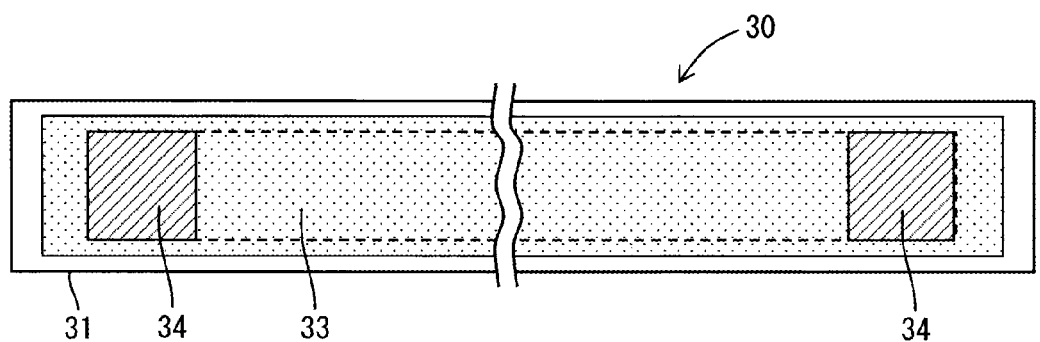
FIG. 3 is a plan view showing the single diode of FIG. 2.
Figure 4:
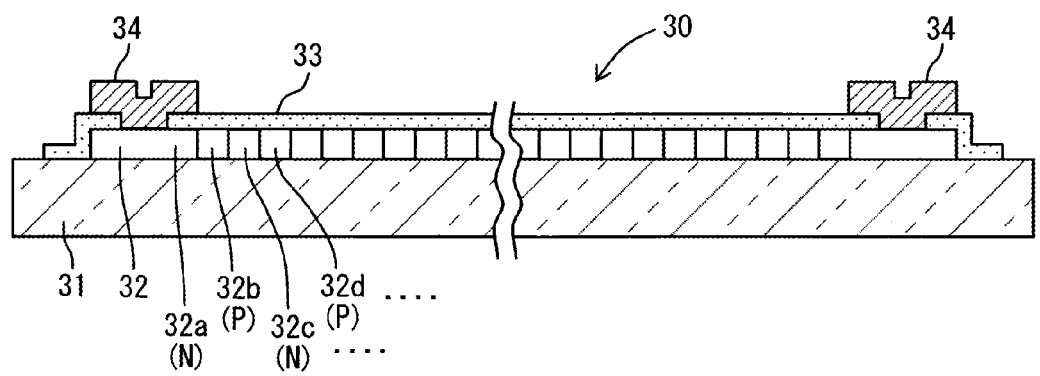
FIG. 4 is a sectional view showing the single diode of FIG. 3.

As shown in FIG. 2, the diode D1 is configured by molding a semiconductor chip 30 and lead terminals 30b, 30c connected to the semiconductor chip 30 with mold resin 30a. As shown in FIGS. 3 and 4, the semiconductor chip 30 includes an insulated substrate 31, a diode element 32, an insulating coating layer 33, and electrodes 34. The diode element 32 is formed on the insulated substrate 31. The insulating coating layer 33 coats the diode element 32 from the opposite side of the insulated substrate 31. The electrodes 34 are connected to the diode element 32.

The diode element 32 has a plurality of N-type regions 32a, 32c and a plurality of P-type regions 32b, 32d. The N-type regions 32a, 32c and the P-type regions 32b, 32d are alternately arranged in series to form PN junctions. The length in the electric conduction direction (horizontal direction in FIG. 4) of a set of the adjacent N-type region 32a and the P-type region 32b is preferably 1.5 to 5 µm.

In examples shown in FIGS. 3 and 4, the areas are arranged in a straight line. Hence, the mold resin 30a has a circular cylindrical shape extending in the longitudinal direction of the diode element 32 (horizontal direction in FIGS. 2 to 4). The electrodes 34 are connected to the ends of the diode element 32. Although the diode element 32 is sealed by being interposed between the insulated substrate 31 and the insulating coating layer 33, a pair of electrodes 34 is exposed from the insulating coating layer 33. Although not shown in FIGS. 3 and 4, the electrodes 34 are connected to the lead terminals 30b, 30c shown in FIG. 2.

The insulated substrate 31 has a sufficient thickness and stiffness compared with the diode element 32. Concrete examples of materials of the insulated substrate 31 include insulators such as quartz glass, sapphire, and ceramics. Specifically, quartz glass, sapphire, or alumina ceramics may be formed into a wafer so as to be suitably used for the insulated substrate 31.

In the example shown in FIG. 4, the thickness of the diode element 32 is 1 µm, and the length in the electric conduction direction of the diode element 32 is 20 mm (3.5 µm×5700 sets). Polysilicon is used for the material of the diode element 32.

As described above, in the diode element 32, a plurality of Zener diodes Da, Db, Dc (see FIG. 5) are connected in series in a state where the adjacent diodes are opposite in direction to each other. Each of the Zener diodes Da, Db, Dc is configured of a set of the N-type regions 32a and the P-type region 32b. Hereinafter, technical significance of this configuration will be described.

Figure 6A:
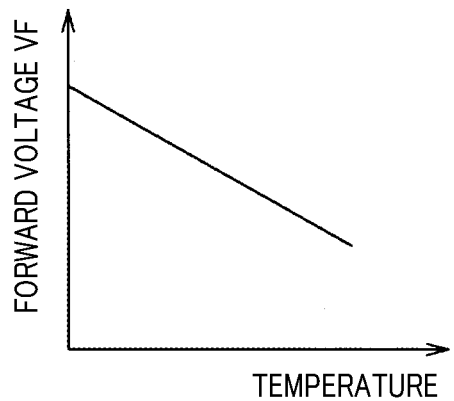
FIGS. 6A, 6B and 6C are diagrams showing temperature characteristics of the diode according to the first embodiment.
Figure 6B:
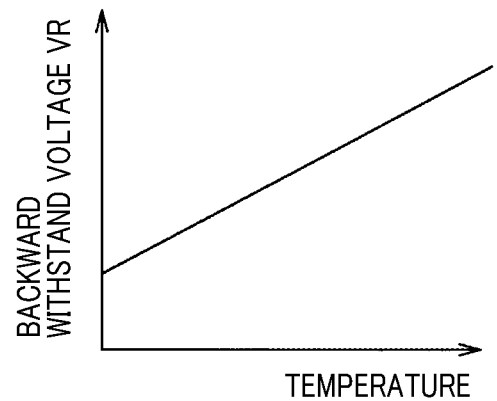

There is an inverse relationship between a temperature characteristic of voltage (forward voltage) obtained when a voltage is applied in the forward direction of the Zener diodes Da, Db, Dc (see FIG. 6A) and a temperature characteristic of Zener voltage (backward withstand voltage) obtained when a voltage is applied in the backward direction of the Zener diodes Da, Db, Dc (see FIG. 6B). That is, as the temperature becomes higher, the forward voltage becomes lower and the backward withstand voltage becomes higher. Hence, a pair of Zener diodes Da, Db, which are connected so as to be opposite in direction to each other and opposed to each other, mutually cancels increase and decrease of the voltage value caused due to the temperature characteristic. Hence, the temperature characteristic of the Zener voltage of the diode element 32x (diode D1) can be moderate.

Figure 6C:
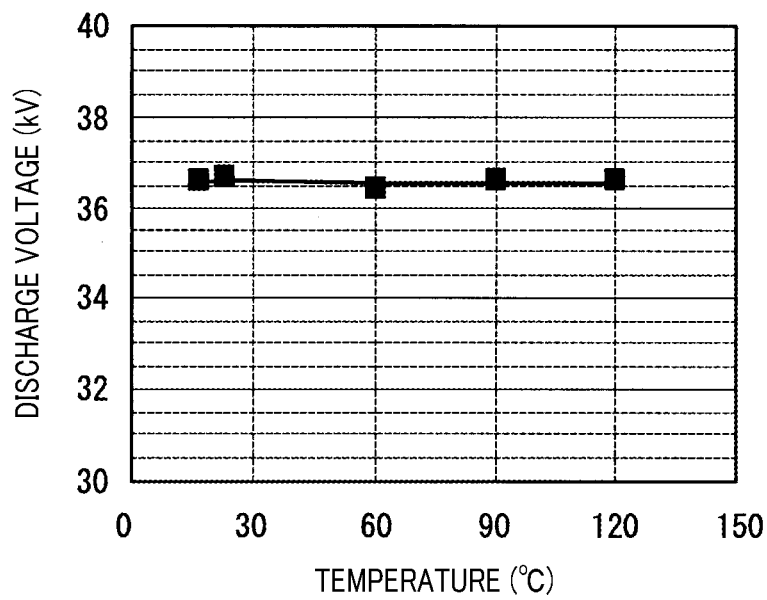

FIG. 6C shows a result of a test of a relationship between peak values of discharge voltage of the spark plug 20 and environmental temperatures. According to this result, since the temperature characteristic of the diode D1 is made moderate, discharge voltage (peak voltage) of the spark plug 20 can be stabilized without depending on the temperature. In addition, since a large number of sets of N-type and P-type regions (5700 sets in the example shown in FIG. 4) are connected in series, Zener voltage of the diode D1 is increased to a desired value (e.g. 36 kV).

In the example shown in FIG. 4, the thickness of the insulated substrate 31 is 0.5 mm. That is, the insulated substrate 31 is not a film, but has stiffness with which the diode element 32 can be supported so as not to be deformed. In addition, in the example shown in FIG. 4, the material and thickness of the insulated substrate 31 are set so that the insulated substrate 31 has dielectric voltage of 200 kV. That is, the material and thickness of the insulated substrate 31 are set so that the insulated substrate 31 has sufficient withstand voltage compared with the Zener voltage of the diode D1 (e.g. 36 kV).

Next, one embodiment of a procedure (manufacturing method) of manufacturing the diode D1 having the above structure will be described.

First, polysilicon is deposited on a quartz wafer, which serves as a base material of the insulated substrate 31, by CVD (chemical vapor deposition) method. Next, B (boron) is ion-implanted in the whole surface of the polysilicon and thermal annealing is performed. Hence, P-type polysilicon is formed on the quartz wafer. Next, diode regions are etched. P (phosphorus) is ion-implanted by using a resist as a mask. In this state, thermal annealing is performed to form the N-type regions 32a, 32c and the P-type regions 32b, 32d in desired positions on the insulated substrate 31 so as to be alternately arranged. That is, the diode element 32 is formed on the insulated substrate 31.

Next, the polysilicon is subjected to thermal oxidation, whereby silicon dioxide (SiO2) is formed on a surface of the diode element 32. PSG (phosphorus silicate glass) is deposited on the silicon dioxide by CVD. Next, contact holes are formed in the PSG. The contact holes are formed at positions which are ends of the diode element 32 and where the electrodes 34 are formed. Next, Au/Ni/Ti is subjected to sputtering on the PSG. Next, the sputtered metal layer is subject to patterning by photolithography, whereby the electrodes 34 are formed on the ends of the diode element 32.

Next, polyimide is coated on the diode element 32 and the electrodes 34 on the insulated substrate 31 to form an insulating layer 33, in which openings are formed at positions corresponding to the electrodes 34, by photolithography. Thereby, a Zener diode wafer is completed. Then, the completed Zener diode wafer is subject to dicing so that each semiconductor chip 30 is cut away. Next, lead terminals 30b, 30c are connected to the electrodes 34 of the semiconductor chip 30 by soldering. Next, the whole of the semiconductor chip 30 and the lead terminals 30b, 30c is coated with polyimide. Next, the whole of the coated semiconductor chip 30 is subjected to transfer molding. Thereby, the diode D1 shown in FIG. 2 is completed which has a shape in which the lead terminals 30b, 30c extend from the mold resin 30a enclosing the semiconductor chip 30.

As described above, according to the present embodiment, the PN junctions are alternately connected in series to form the diode element 32. Hence, a pair of diodes Da, Db, which are connected so as to be opposite in direction to each other and opposed to each other, mutually cancels increase and decrease of the voltage value caused due to the temperature characteristic. Thereby, the temperature characteristic of the diode D1 can apparently be moderate, and the temperature dependence of Zener voltage can be lower. Hence, discharge voltage (peak voltage) of the spark plug 20 can be stabilized without depending on the temperature.

In addition, according to the present embodiment, since N-type and P-type regions are formed on the insulated substrate 31, withstand voltage of the insulated substrate 31 can be sufficiently and easily higher. Hence, while preventing the N-type regions 32a, 32c and the P-type regions 32b, 32d from being short-circuited via the insulated substrate 31, Zener voltage of the diode D1 can be sufficiently higher by increasing the number of the PN junctions.

Furthermore, according to the present embodiment, the following advantages (a) to (c) can be obtained.

(a) In the present embodiment, the N-type regions 32a, 32c and the P-type regions 32b, 32d are formed in the polysilicon. Accordingly, the formation, in which the N-type regions 32a, 32c and the P-type regions 32b, 32d are alternately formed in series on the insulated substrate 31, can be easily realized by using CVD. In addition, when forming N-type regions and P-type regions in single-crystal silicon, the time for heat treatment is required for diffusing impurities into the bottom of the single-crystal silicon. However, according to the present embodiment in which N-type regions and P-type regions are formed in polysilicon, the time for heat treatment can be shortened. This is because polysilicon has a diffusion coefficient of impurities higher than that of single-crystal silicon due to grain boundaries.

Figure 8:
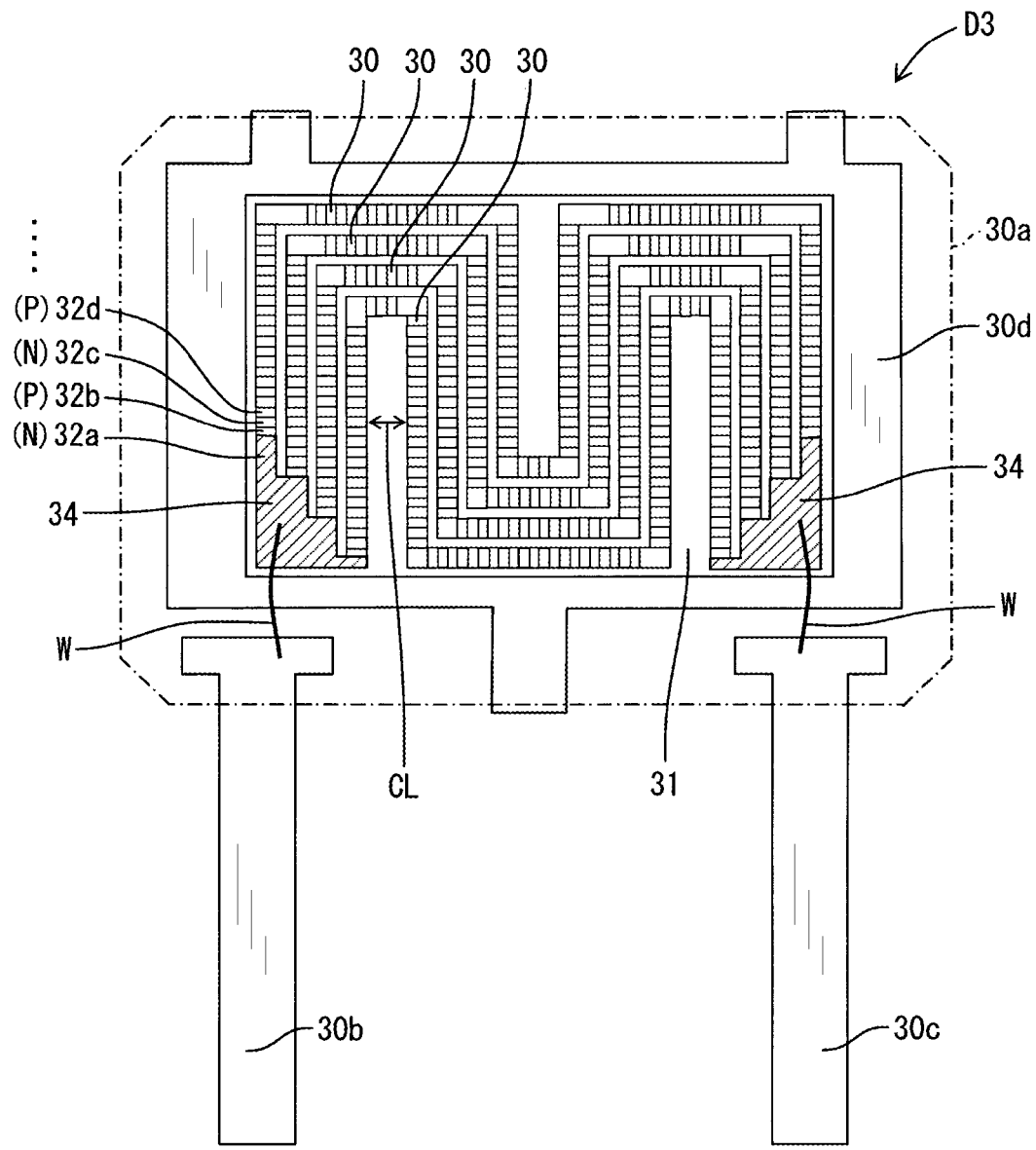
FIG. 8 is a diagram showing a diode according to a third embodiment.

(b) Unlike the present embodiment, when the N-type regions 32a, 32c and the P-type regions 32b, 32d are arranged so as to be meandering as illustrated in FIG. 8, the clearance produced by the meander (see CL in FIG. 8) is required to be sufficiently large to prevent dielectric breakdown from being caused by the meander. To solve this problem, in the present embodiment, the N-type and P-type regions are formed so as to be arranged in a straight line on the insulated substrate 31. Hence, the concern about a short circuit due to the clearance CL can be resolved.

(c) In the present embodiment, the diode D1 is applied as a constant voltage diode which is connected to the secondary side of the ignition coil 10 and functions so as to prevent the voltage exceeding the Zener voltage from being applied to the spark plug 20. As described above, since an extremely high voltage (several tens of kV) is applied to the diode connected to the secondary side, high withstand voltage is required for the diode. On this point, the above-described advantage of the present embodiment is preferably exerted that the Zener voltage can be sufficiently made higher.

(Second Embodiment)

Figure 7:
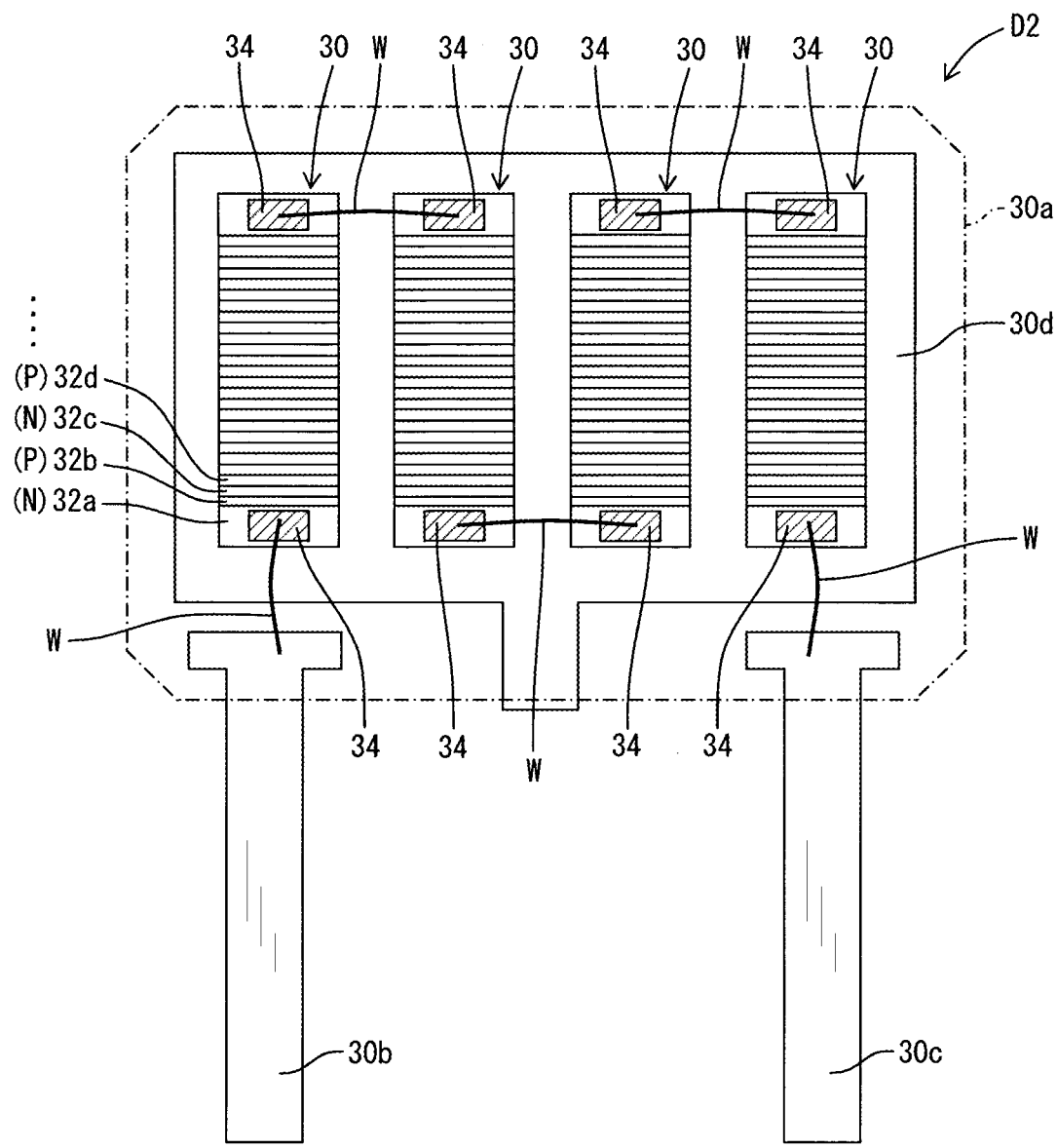
FIG. 7 is a diagram showing a diode according to a second embodiment.

In the first embodiment, one semiconductor chip 30 (i.e. one diode element 32) is molded to form the diode D1. However, in the present embodiment shown in FIG. 7, a plurality of semiconductor chip 30 are integrally molded to form a diode D2.

Specifically, a plurality of semiconductor chips 30 having the same structure as those shown in FIGS. 3 and 4 are arranged side by side on a lead frame 30d. In the example shown in FIG. 7, the semiconductor chips 30 are arranged side by side so that the longitudinal directions thereof are the same. In addition, the electrodes 34 of the semiconductor chips 30 are connected by wires W so that the semiconductor chips 30 are electrically connected in series. The lead frame 30d is made of metal such as copper and has electrical conductivity.

The number of the PN junctions is increased to make the Zener voltage of the diode D2 sufficiently high, as in the case of the first embodiment. However, if configuring the diode with one semiconductor chip 30 as shown in FIGS. 3 and 4, the entire length of the diode increases due to the increased number of the PN junctions, which can make it difficult to install the diode in a predetermined portion.

According to the present embodiment, in consideration of the above point, a plurality of semiconductor chips 30 are provided which have the diode elements 32 formed so that the P-type regions and the N-type regions are arranged in a predetermined direction (vertical direction in FIG. 7) and in a line. The semiconductor chips 30 are electrically connected in series by wire bonding. In addition, the semiconductor chips 30 are arranged on the lead frame 30d so that the N-type and P-type regions 32a, 32c, 32b, 32d meander.

Hence, the external shape of the diode D2 can be rectangular while preventing the diode D2 from having a long bar shape extending in a predetermined direction. Thereby, the diode D2 can be easily installed even in a predetermined portion where a bar-shaped one cannot be easily installed.

(Third Embodiment)

In the second embodiment, a plurality of semiconductor chips 30, in which the N-type and P-type regions 32a, 32c, 32b, 32d are arranged in the predetermined direction (vertical direction in FIG. 7) and in a line, are arranged in the direction perpendicular to the predetermined direction (horizontal direction in FIG. 7) and then are connected by wire bonding. Thereby, the N-type and P-type regions 32a, 32c, 32b, 32d are arranged so as to be meandering. In contrast, in the present embodiment shown in FIG. 8, a plurality of semiconductor chips 30, in which the N-type and P-type regions 32a, 32c, 32b, 32d form PN junctions in series so as to be in a line, are meandering and are arranged on the lead frame 30d. Note that, in the example shown in FIG. 8, a plurality of semiconductor chips 30 are arranged in parallel and are also electrically connected in parallel.

According to the present embodiment configured as described above, the external shape of the diode D3 can be rectangular as in the case of the second embodiment. Hence, the diode D3 can be easily installed even in a predetermined portion where a bar-shaped one cannot be easily installed.

(Fourth Embodiment)

In the second embodiment, the electrodes 34 of the semiconductor chips 30 are directly and electrically connected by wires W. However, in the present embodiment shown in FIGS. 9A and 9B, the electrodes 34 of a plurality of semiconductor chips 30 are connected to the lead frame 30d, whereby the semiconductor chips 30 are connected in series via the lead frame 30d. In the example shown in FIGS. 9A and 9B, a diode D4 includes a first diode element 301 and a second diode element 302. Note that a positive terminal electrically connected to one end of the first diode element 301 corresponds to the lead terminal 30b, and a negative terminal electrically connected to one end of the second diode element 302 corresponds to the lead terminal 30c. The other end of the first diode element 301 and the other end of the second diode element 302 are connected via the lead frame 30d and the wires W.

The number of the PN junctions included in the first diode element 301 and the number of the PN junctions included in the second diode element 302 are the same. This means that the first diode element 301 and the second diode element 302 are connected to the lead frame 30d at the intermediate position thereof. Hence, an intermediate value between a potential of the positive terminal 30b and a potential of the negative terminal 30c is a potential of the lead frame 30d.

Although not shown in FIG. 9B, the insulated substrate 31 is interposed between the diode element 32 and the lead frame 30d. Hence, as a potential difference between the lead frame 30d and the positive terminal 30b and a potential difference between the lead frame 30d and the negative terminal 30c become larger, withstand voltage required for the insulated substrate 31 becomes higher.

According to the present embodiment, in consideration of the above point, the first diode element 301 and the second diode element 302 are connected to the lead frame 30d at the intermediate position thereof. Hence, in both the first diode element 301 and the second diode element 302, the potential difference can be restrained from being larger. Hence, withstand voltage required for the insulated substrate 31 can be lower.

(Fifth Embodiment)

In the fourth embodiment, both the first and second diode elements 301, 302 are mounted on one surface (front surface) of the lead frame 30d. However, in the present embodiment shown in FIGS. 10A and 10B, the first diode element 301 is mounted on a front surface of the lead frame 30d, and the second diode element 302 is mounted on a rear surface of the lead frame 30d. According to this configuration, a diode D5 can be miniaturized in the width direction (horizontal direction in FIGS. 9A, 9B, 10A and 10B).

(Sixth Embodiment)

Figure 11:
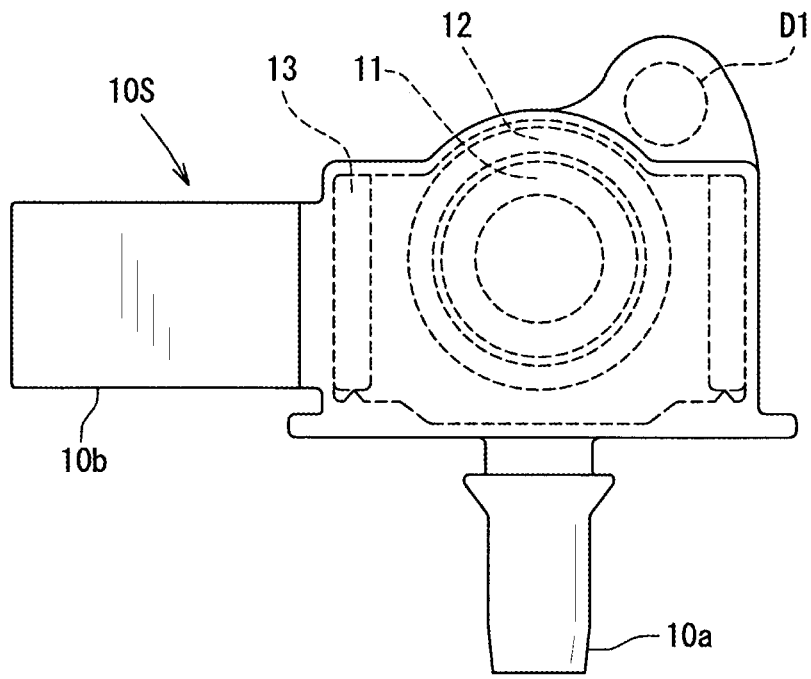
FIG. 11 is a diagram showing a diode according to a seventh embodiment.

In the present embodiment, the diode D1 shown in FIG. 2 is installed in a coil mounted on the spark plug 20, so-called a plug top coil (hereinafter, referred to as "PTC 10S") (see FIG. 11).

The PTC 10S is a structure in which the primary coil 11, the secondary coil 12, and the igniter 13 are integrally formed together with the diode D1 by using resin. Note that the PTC 10S includes a socket 10a to which the spark plug 20 is connected. In addition, the PTC 10S includes a connector 10b having a power supply line connected to the primary coil 11 and a ignition command signal line connected to the igniter 13.

The diode D1 according to the present embodiment has a cylindrical shape. The cylindrical diode D1 is arranged so as to be adjacent to the primary coil 11 and the secondary coil 12. That is, the diode D1 is included in the PTC 10S so that center line of the coils 11 and 12 and a center line of the diode D1 are in parallel.

(Seventh Embodiment)

Figure 12:
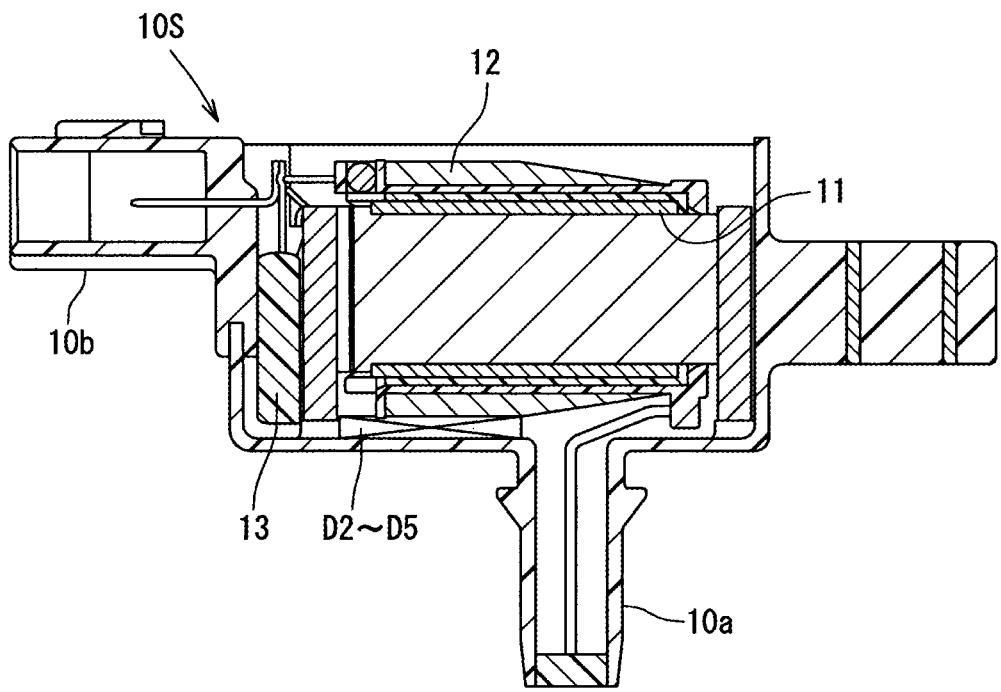
FIG. 12 is a diagram showing a diode according to an eighth embodiment.
Figure 13:
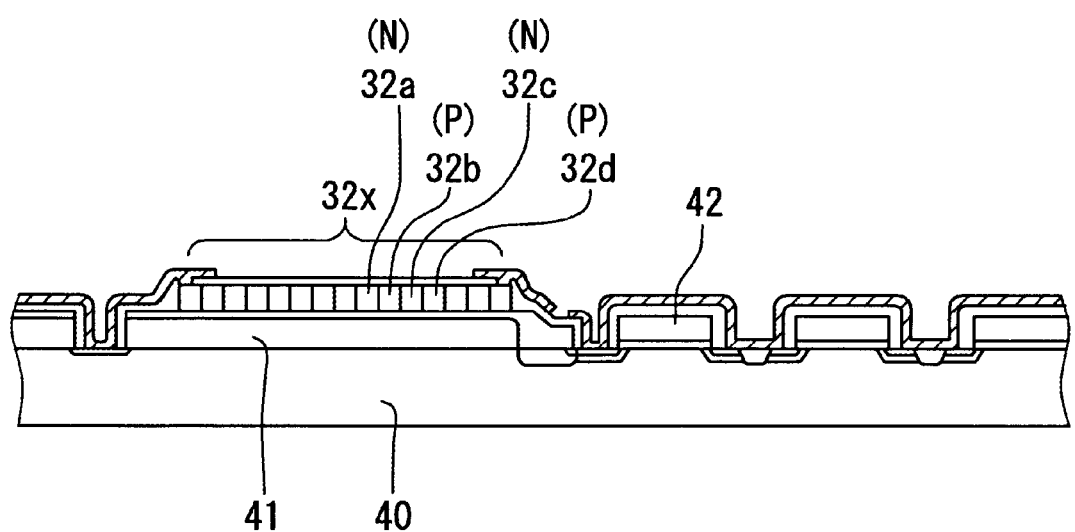
FIG. 13 is a sectional view showing a conventional diode element.

In the present embodiment, the diodes D2 to D5 shown in FIGS. 7 to 10 are included in the PTC 10S (see FIG. 12).

The diodes D2 to D 5 according to the present embodiment have a cubic shape. The cubic diodes D2 to D 5 are arranged so as to be adjacent to the primary coil 11 and the secondary coil 12. That is, the diodes D2 to D 5 are arranged at a portion opposite to the primary coil 11 with respect to the secondary coil 12.

(Eighth Embodiment)

Extremely high discharge voltage of the spark plug 20 is not desirable for restraining electrode wear of the spark plug 20. In contrast, extremely low discharge voltage of the spark plug 20 is not desirable for maintaining stable discharge in the spark plug 20. In consideration of the above points, it is desirable that discharge voltage of the spark plug 20 is 32 to 38 kV (more preferably, 33 to 37 kV) in a range of operating temperature between −30° C. and 120° C.

Zener voltage Vz of the diodes D1 to D5 are equal to the discharge voltage of the spark plug 20. Hence, it is desirable that Zener voltage Vz is 32 to 38 kV (more preferably, 33 to 37 kV) in a range of operating temperature between −30° C. and 120° C.

The Zener voltage Vz changes substantially linearly with respect to the temperature, and is expressed as the equation:

$Vz=V0\times(1+K\times T)$. Vo is Vz (33.8 kV) at 0° C. K is a Zener voltage temperature coefficient. Based on this equation, if K is set to 700 ppm/° C. or less, discharge voltage can be fallen within the range of 32 to 38 kV described above.

In consideration of the above points, in the present embodiment, the diode is manufactured so that the Zener voltage temperature coefficient is 700 ppm/° C. or less. Specifically, by controlling carrier densities of P-type regions and N-type regions, the Zener voltage temperature coefficient is adjusted so as to be 700 ppm/° C. or less. Hence, electrode wear of the spark plug 20 can be restrained, and stable discharge can be maintained.

(Ninth Embodiment)

In the first embodiment, N-type regions and P-type regions are formed in polysilicon. In contrast, in the present embodiment, N-type regions and P-type regions are formed in single-crystal silicon. Note that the configuration of the present embodiment is the same as those of the above embodiments in that an equivalent circuit is formed in which a plurality of diodes are connected in series in a state where the adjacent diodes are opposite in direction to each other.

Hereinafter, a concrete example of a method of manufacturing a diode will be described. First, an SOS (Silicon On Sapphire) wafer is manufactured in which single-crystal silicon is subject to epitaxial growth on a sapphire wafer. Next, the single-crystal silicon layer of the SOS wafer is subject to processes such as photolithography, ion implantation, diffusion, and electrode formation, as in the case of the first embodiment. Thereby, a Zener diode wafer is completed. Furthermore, as in the case of the first embodiment, the Zener diode wafer is subject to dicing so that each semiconductor chip 30 is cut away. Next, soldering for the lead terminals 30*b*, 30*c* and transfer molding and the like are performed, thereby completing the diode D1.

As described above, according to the present embodiment, since N-type and P-type regions are formed in single-crystal silicon, the high-performance diode D1 having lower operation resistance can be manufactured.

(Tenth Embodiment)

In the ninth embodiment, single-crystal silicon is formed on a sapphire wafer. However, in the present embodiment, single-crystal silicon is formed in an SOI (Silicon On Insulator) layer of a laminated wafer including an insulating film. Next, the whole wafer is immersed in hydrofluoric acid aqueous solution. Then, only the SOI layer in which a diode is formed is removed (lift-off). Thereby, a thin-film diode wafer is formed. Next, the thin-film diode wafer is mounted on a quartz glass substrate, and is subject to heat treatment. Next, electrodes are formed on the substrate, thereby completing a diode element formed of single-crystal silicon formed on the quartz glass substrate. The diode element is an equivalent circuit in which a plurality of diodes are connected in series in a state where the adjacent diodes are opposite in direction to each other. Furthermore, as in the case of the first embodiment, the Zener diode wafer is subject to dicing so that each semiconductor chip 30 is cut away. Next, soldering for the lead terminals 30*b*, 30*c* and transfer molding and the like are performed, thereby completing the diode D1.

As described above, according to the present embodiment, since N-type and P-type regions are formed in single-crystal silicon, the high-performance diode D1 having lower forward voltage VF can be manufactured.

(Eleventh Embodiment)

In the above embodiments, polysilicon or single-crystal silicon is formed on the insulated substrate 31, and the N-type regions 32*a*, 32*c* and the P-type regions 32*b*, 32*d* are formed in the silicon. In contrast, according to the present embodiment, polycrystalline silicon carbide or single-crystal silicon carbide is formed on the insulated substrate 31, and the N-type regions 32*a*, 32*c* and the P-type regions 32*b*, 32*d* are formed in the silicon carbide. For example, in the diode D1 shown in FIGS. 2 to 4, silicon used for forming the N-type regions 32*a*, 32*c* and the P-type regions 32*b*, 32*d* is replaced with silicon carbide to manufacture the diode of the present embodiment.

When using polycrystalline silicon carbide, the polycrystalline silicon carbide is formed on the insulated substrate 31 by high temperature CVD. Hence, it is desirable to use sapphire having a high heat resistance property for the insulated substrate 31. Then, impurity ions are implanted into the polycrystalline silicon carbide to form the N-type regions 32*a*, 32*c* and the P-type regions 32*b*, 32*d*. Concrete examples of the impurities include N (nitrogen) used when the N-type regions 32*a*, 32*c* are formed, Al (aluminum) and B (boron) used when the P-type regions 32*b*, 32*d* are formed.

The diffusion coefficient of impurities of silicon carbide is extremely lower than that of silicon. Hence, it is desirable that ion implantation (multistep ion implantation) is performed with multistep high acceleration voltage, and thereafter activation annealing is performed. Accordingly, ion-implanted impurities are electrically activated, thereby uniformizing the impurity concentration in the depth direction.

As described in the eighth embodiment, the Zener voltage temperature coefficient K is desirably 700 ppm/° C. or less. In a case of silicon carbide, if a unit diode including a set of an N-type region and a P-type region is manufactured so that Zener voltage thereof is between 20 V and 28V, the Zener voltage temperature coefficient K becomes substantially zero. Hence, if the Zener voltage of a unit diode is set to 24 V, a 36 kV Zener diode can be formed by connecting 1500 sets of unit diodes in series. In contrast, according to the first embodiment in which silicon is used, it is required to connect 5700 sets of unit diodes in series to form a 36 kV Zener diode.

If the length of a unit diode in the electric conduction direction (line and space of a PN junction) is too short, a punch through phenomenon is caused in which a depletion layer extending from the P-type region and a depletion layer extending from the N-type region are connected. Thereby, a desired Zener voltage cannot be obtained. The minimum length, in which the punch through phenomenon is not caused, obtained when using silicon carbide is smaller than that obtained when using silicon. For example, in a case of a unit diode manufactured by using polycrystalline silicon carbide, the minimum length, in which the punch through phenomenon is not caused, is 1.0 µm. In contrast, in a case of a unit diode manufactured by using polysilicon, the minimum length is 1.5 µm.

As described above, according to the present embodiment, the number of sets in which unit diodes are connected in series can be smaller. In addition, the whole length of a unit diode can be shortened. Hence, the whole length of the diode can be shortened, thereby miniaturizing the diode.

(Other Embodiments)

It will be appreciated that the present invention is not limited to the configurations described above, but any and all modifications, variations or equivalents, which may occur to those who are skilled in the art, should be considered to fall within the scope of the present invention. In addition, characteristic configurations of the embodiments may optionally be combined.

In the first embodiment, a quartz wafer is used as a base material of the insulated substrate 31. However, a sapphire wafer may be used. In addition, although a sapphire wafer is used as a base material of the insulated substrate 31 in the ninth and tenth embodiments, a quartz wafer may be used. In addition, as the insulated substrate, an alumina wafer may be used which is formed of ceramic whose main component is Al2O3 (aluminum oxide) as in the case of sapphire. In this case, the diode can be manufactured with manufacturing cost lower than that of a diode manufactured by using single-crystal sapphire.

The diodes D1 to D5 are configured so as to be an equivalent circuit in which a plurality of unit diodes are connected in a state where the adjacent diodes are opposite in direction to each other. However, it is desirable that the diodes D1 to D5 are manufactured so that withstand voltage of the unit diodes is between 6 V to 7 V. Accordingly, the temperature characteristic of discharge voltage (Zener voltage) shown in FIG. 6C can be moderate. That is, the discharge voltage can be further stabilized without depending on the temperature.

It is desirable that the length in the electric conduction direction of the unit diode is between 1.5 µm and 5 µm. Hereinafter, technical significance of these values will be described. If Zener voltage of the unit diode is set to 6.3 V, temperature dependence of Zener voltage of the whole diode element can be eliminated. In addition, in a case where the Zener voltage is set to 6.3 V as described above, if the length in the longitudinal direction of the unit diode is set to less than 1.5 µm, a punch through phenomenon is caused in which a depletion layer extending from the P-type region and a depletion layer extending from the N-type region are connected. Thereby, desired Zener voltage cannot be obtained. Hence, as described above, the length in the longitudinal direction of the unit diode is preferably 1.5 µm or more. In addition, if the length of the unit diode is longer than 5 µm, not only the whole length of the diode becomes longer but also operation resistance thereof becomes larger. Hence, the length in the longitudinal direction of the unit diode is preferably 5 µm or less.

Although the diode is formed in single-crystal silicon in the ninth embodiment, the diode may be formed in polysilicon which is grown on sapphire by CVD.

According to the eleventh embodiment, silicon carbide is formed on the insulated substrate 31 by CVD, and impurities are added into the silicon carbide by ion implantation. In contrast, when depositing silicon carbide (e.g. polycrystalline silicon carbide) on the insulated substrate 31 by CVD, impurities may be added into a source gas, and carriers may be formed with the impurities while forming the silicon carbide. In this case, it is desirable that sapphire is used for the insulated substrate 31, and polycrystalline silicon carbide is used for the silicon carbide.

In addition, when growing a silicon carbide film on the sapphire substrate, the growth temperature may be increased to form single-crystal silicon carbide by epitaxial growth. If the single-crystal silicon carbide is formed, operation resistance can be lower compared with when using the polycrystalline silicon carbide.

Hereinafter, aspects of the above-described embodiments will be summarized.

As an aspect of the embodiment, a diode is provided which includes at least one diode element which has a plurality of N-type regions and a plurality of P-type regions, the N-type regions and the P-type regions being alternately arranged in series to form PN junctions; and an insulated substrate which has electric insulation. The N-type regions and the P-type regions are formed on the insulated substrate.

According to the above diode, since the PN junctions are alternately connected in series to form the diode element, the diode element serves as an equivalent circuit in which a plurality of diodes Da, Db, Dc (see FIG. 5) are connected in series in a state where the adjacent diodes are opposite in direction to each other. Hence, a pair of diodes Da, Db, which are connected so as to be opposite in direction to each other and opposed to each other, mutually cancels increase and decrease of the voltage value caused due to the temperature characteristic. Hence, the temperature dependence of the Zener voltage can be lower.

In contrast, for example, when N-type regions and P-type regions are formed on a semiconductor substrate via an insulating film (see U.S. Pat. No. 5,365,099), it is difficult to sufficiently increase the withstand voltage of the insulating film. To solve this problem, in the above embodiment, since the N-type regions and P-type regions are formed on the insulated substrate 31, the above insulating film is not necessary. In addition, the withstand voltage of the insulated substrate can make higher easily. Hence, while ensuring the withstand voltage of the insulated substrate sufficiently, the number of the PN junctions can be increased, thereby making the Zener voltage of the diode sufficiently higher.

What is claimed is:

1. A diode, comprising:
   at least one diode element which has a plurality of N-type regions and a plurality of P-type regions, the N-type regions and the P-type regions being alternately arranged in series to form PN junctions; and
   an insulated substrate which has electric insulation and includes quartz glass, sapphire, or alumina ceramics, wherein
   the N-type regions and the P-type regions are formed on the insulated substrate,
   the N-type regions and the P-type regions are formed in polycrystalline silicon carbide or single-crystal silicon carbide,
   a Zener voltage of a unit diode including a set of the N-type region and the P-type region is between 20 V and, 28 V,
   the diode is connected to a secondary side of an ignition coil installed in an internal-combustion engine, and is a constant voltage diode which functions so as to prevent applying a discharge voltage exceeding the Zener voltage to a spark plug, and
   the discharge voltage applied to the spark plug is 32 to 38 kV in a range of operating temperature between −30° C. and 120° C.

2. The diode according to claim 1, wherein
   the at least one diode element has a thin-film shape, and
   the at least one diode element is laminated on the insulated substrate.

3. The diode according to claim 1, wherein
   the at least one diode element is arranged so as to be meandering,
   the at least one diode element being in a state where the P-type regions and the N-type regions are in a line by forming PN junctions in series.

4. The diode according to claim 1, wherein
   the at least one diode element is formed so that the P-type regions and the N-type regions are arranged in a predetermined direction and in a line, and
   the at least one diode element comprises a plurality of diode elements which are electrically connected in series by wire bonding, and are arranged so that the P-type regions and the N-type regions are meandering.

5. The diode according to claim 1, wherein
the at least one diode element is arranged so that the P-type regions and the N-type regions are arranged in a straight line on the insulated substrate.

6. The diode according to claim 1, wherein the at least one diode element comprises a plurality of diode elements, and the diode further comprising:
a lead frame in which the diode elements are mounted via the insulated substrate;
a positive terminal which is electrically connected to one end of a first diode element of the diode elements; and
a negative terminal which is electrically connected to one end of a second diode element of the diode elements, wherein
the other end of the first diode element and the other end of the second diode element are connected via the lead frame.

7. The diode according to claim 1, wherein
when a Zener voltage temperature coefficient is expressed as K in an equation: $Vz=V0\times(1+K\times T)$, where Vz is a Zener voltage of the at least one diode element, T is a temperature of the at least one diode element, and V0 is the Zener voltage Vz obtained when the temperature is 0° C., the Zener voltage temperature coefficient K is 700 ppm/° C. or less.

\* \* \* \* \*